United States Patent
Fruth et al.

[11] Patent Number: 5,959,345
[45] Date of Patent: Sep. 28, 1999

[54] EDGE TERMINATION FOR ZENER-CLAMPED POWER DEVICE

[75] Inventors: John Rothgeb Fruth, Kokomo; Stephen Paul Barlow, Noblesville; Donald Ray Disney, Kokomo, all of Ind.

[73] Assignee: Delco Electronics Corporation, Kokomo, Ind.

[21] Appl. No.: 08/980,225

[22] Filed: Nov. 28, 1997

[51] Int. Cl.[6] .................. H01L 29/861; H01L 31/107; H01L 23/62
[52] U.S. Cl. .................. 257/605; 257/603; 257/355; 257/551; 257/481
[58] Field of Search .................. 257/603, 551, 257/481, 605, 355, 546

[56] References Cited

U.S. PATENT DOCUMENTS

| | | | |
|---|---|---|---|
| 5,397,914 | 3/1995 | Suda et al. | 257/551 |
| 5,475,258 | 12/1995 | Kato et al. | 257/603 |
| 5,502,338 | 3/1996 | Suda et al. | 257/551 |
| 5,545,915 | 8/1996 | Disney et al. | 257/491 |

*Primary Examiner*—Valencia Martin-Wallace
*Assistant Examiner*—Jesse A. Fenty
*Attorney, Agent, or Firm*—Jimmy L. Funke

[57] ABSTRACT

A semiconductor power device (100) that includes a number of bipolar or FET power devices (116), an over-voltage clamp (118), and an edge termination structure (110) that separates the power devices (116) and the over-voltage clamp (118). The power devices (116) are formed in an interior region (100a) of a semiconductor substrate (128), while the over-voltage clamp (118) is formed in a peripheral region (100b) of the substrate. The over-voltage clamp (118) and the gate/base terminals of the power devices (116) are formed in a polysilicon layer (126) overlying the substrate (128), such that the over-voltage clamp (118) is connected between the anode and gate/base terminals of each power device (116) to provide over-voltage protection. The edge termination structure (110) is formed in the substrate (128) so as to completely surround the interior region (100a) of the substrate (128), and therefore surrounds the power devices (116) to form a continuous barrier structure between the power devices (116) and the over-voltage clamp (118). The edge termination structure (110) includes a main junction (112) and at least one field-limiting ring (114), each of which is formed by a continuous well of the same electrical conductivity type. The edge termination structure (110) also includes a pair of field plates, a first (142) of which contacts the field-limiting ring (114) and a second (138) contacts the polysilicon layer (126) so as to make electrical contact with a gate terminal of the main junction (112).

20 Claims, 3 Drawing Sheets

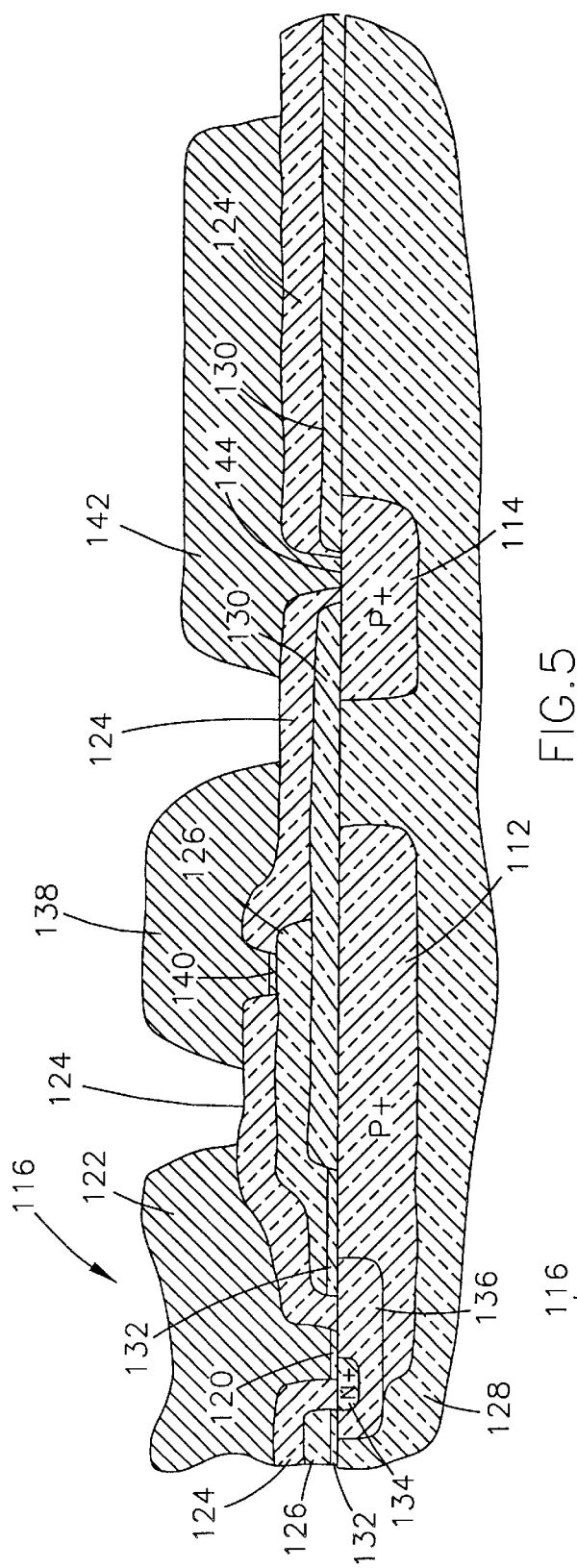
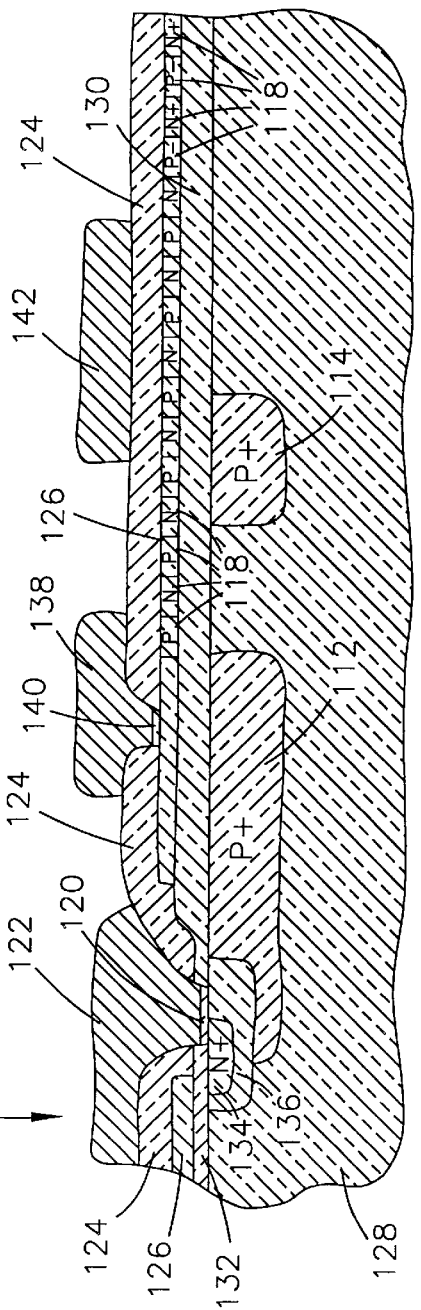

EDGE TERMINATION FOR ZENER-CLAMPED POWER DEVICE

FIELD OF THE INVENTION

The present invention generally relates to semiconductor devices and their processing methods. More particularly, this invention relates to a power device having a monolithic over-voltage zener clamp and an edge termination that includes at least one field-limiting ring.

BACKGROUND OF THE INVENTION

Semiconductor power devices, an example of which is shown in FIG. 1, typically include thousands of identical "active" cells, such as double-diffused metal-oxide-semiconductor (DMOS) transistors or insulated gate bipolar transistors (IGBT). These transistors are capable of controlling large voltages and currents at their cathode and anode terminals. The terminals of these devices are typically formed by a substrate, a polysilicon layer, and heavily-doped islands in the substrate, with a dielectric layer being present between the substrate and polysilicon layer to electrically insulate these structures from each other.

An IGBT 10 of a conventional IGBT power device is represented in FIG. 2. The IGBT 10 is formed in a substrate 12 to include a well 14 (e.g., a P-well), an island 16 (e.g., an N+ region within the P-well) beneath a hole formed in a polysilicon layer 18, and a metallization 20 overlying the polysilicon layer 18. The metallization 20 extends down through the hole to contact the island 16. When a positive voltage is applied to the polysilicon layer 18 (the gate terminal 28 of the IGBT 10), the surface of each well 14 is inverted, creating a channel through which electrons can laterally flow from the island 16 (the emitter/cathode region of the IGBT 10) to the substrate 12 and thereafter downward through the substrate 12 to a collector (anode) terminal 24.

An over-voltage (OV) clamp is generally required to protect the individual power devices of a semiconductor power device from experiencing avalanche breakdown. With continued reference to the IGBT power device of FIG. 2, which is schematically represented in FIG. 3, a string of polysilicon zener diodes 26 are shown as being connected between the collector (anode) terminal 24 and the gate terminal 28 of the IGBT 10 for this purpose. As shown in FIG. 2, the zener diode string 26 is typically formed in a section of the polysilicon layer 18 above a field oxide layer 22. As indicated by FIG. 3, the zener diode string 26 is located outside of the "active" area of the power device, i.e., that area of the substrate 12 in which the IGBT 10 is formed. A conventional arrangement can be seen from FIG. 1, in which a rectangular-shaped peripheral region 12a of the substrate 12 is allocated for the zener diode string 26, while the remainder of the substrate 12 forms an "active" region 12b of the substrate 12 for numerous IGBTs 10.

The breakdown voltage (BV) of the zener diode string 26 is designed to be less than the BV of the IGBTs 10. When the power device is "off," point "A" of a resistor 32, formed by a dielectric layer 30 (FIG. 2) separating the metallization 20 and the polysilicon layer 18, is "grounded" (i.e., connected to the emitter/cathode 16). If the anode voltage exceeds the BV of the zener diode string 26, current flows from the collector (anode) terminal 24 through the zener diode string 26 and the resistor 32 to the island (cathode) 16, causing a voltage to develop across the resistor 32. If this voltage exceeds the threshold voltage of the IGBT 10, the power device turns on and dissipates the energy present at the collector (anode) terminal 24, thereby protecting the IGBT 10 by preventing avalanche breakdown. Advantageously, the BV of the zener diode string 26 is much more stable over temperature and process variation than that of the IGBT 10, or any other bipolar or field-effect transistor (FET) device that may be employed in a power device of the type shown in FIG. 1.

The ruggedness of a semiconductor device is generally defined as the ability of the device to resist failure when its BV is exceeded. In order to increase the breakdown voltage and the ruggedness of a semiconductor power device, such as the IGBT of FIGS. 1 through 3, the active area 12b of the substrate 12 must be surrounded by an edge termination structure, such as that represented in FIG. 1 by the reference number 12c. An edge termination structure 12c of the type shown in FIG. 1 generally includes a continuous grounded well region, and possibly one or more floating well regions referred to as field-limiting rings (FLRs). These wells are generally formed by implants of the same impurity type as the wells of the power device, and completely encircle the power devices 10 within the active region 12b of the substrate 12. Because they are continuous, the grounded well region and the field-limiting rings serve to reduce the high electric fields that occur in the sharp corners of the substrate 12. As such, the presence of a grounded well region and one or more field-limiting rings enables a power device to sustain high voltages when in the "off" state. The effectiveness of an edge termination structure can be enhanced by using field plates that overlap the well of the edge termination structure. To achieve a BV of 600 volts, a power device may require one to three field-limiting rings, while six or more field-limiting rings may be required to attain a BV of 1200 volts.

While providing the above benefits, the design of an edge termination structure is complicated if a monolithic over-voltage clamp (e.g., the zener diode string 26 of FIGS. 2 and 3) is present in the "inactive" peripheral region 12a of the substrate 12, necessitating that the edge termination structure 12c be formed between the peripheral and active regions 12a and 12b, respectively, as shown in FIG. 1. As a result, prior art power devices have avoided continuous field-limiting rings, instead employing a single continuous grounded well or a series of polysilicon field plates. While being less complicated to fabricate, such power devices are generally limited to a BV of not more than 600 volts.

In view of the above, it would be desirable if a semiconductor power device were available that was configured to incorporate a monolithic over-voltage clamp and an edge termination structure that included a continuous grounded well and at least one field-limiting ring. Such a device would necessarily be uniquely configured to enable the presence of both the over-voltage clamp and the edge termination structure on the same substrate, yet preferably would be readily processed using known semiconductor processing techniques.

SUMMARY OF THE INVENTION

It is an object of this invention to provide a semiconductor power device equipped with over-voltage protection.

It is another object of this invention that such a power device has a BV of greater than 600 volts.

It is a further object of this invention that such a power device is equipped with a zener diode string that forms an over-voltage clamp, and an edge termination structure that includes a continuous grounded well and at least one field-limiting ring.

It is still another object of this invention that such a power device can be processed using known masking, implanting or diffusion techniques.

In accordance with a preferred embodiment of this invention, these and other objects and advantages are accomplished as follows.

According to the present invention, there is provided a semiconductor power device that includes a number of bipolar or FET power devices, an over-voltage clamp, and an edge termination structure that separates the power devices and the over-voltage clamp. The power devices are formed in an interior region of a semiconductor substrate, while the over-voltage clamp, composed of a string of zener diodes, is formed in a peripheral region of the substrate. The zener diodes and gate/base terminals required for the bipolar/FET power devices, respectively, are formed in a polysilicon layer overlying the substrate, such that the zener diodes are connected between the anode and gate/base terminals of each power device to provide over-voltage protection.

The edge termination structure is formed in the substrate so as to completely surround the interior region of the substrate, and therefore surrounds the power devices, to form a continuous barrier structure between the power devices and the zener diodes. The edge termination structure includes a main junction and one or more field-limiting rings, each of which is formed by a continuous well of the same electrical conductivity type. Each well underlies but is electrically insulated from the polysilicon layer. The continuous well of the main junction is grounded, and will therefore be referred to as a continuous grounded well. The edge termination further includes a dielectric layer between a portion of the polysilicon layer and a portion of the continuous grounded well so as to form a gate terminal of the main junction.

In addition to the above, the edge termination structure includes a pair of field plates. A first of the field plates contacts the field-limiting ring, but is electrically insulated from the polysilicon layer so as to be electrically insulated from the over-voltage clamp. The second field plate contacts the polysilicon layer so as to make electrical contact with the gate terminal of the main junction, but is electrically insulated from the field-limiting ring.

According to this invention, a semiconductor power device as described above has an edge termination structure, including a continuous grounded well and one or more field-limiting rings, in combination with an over-voltage clamp. The ability to combine these structures on a single monolithic semiconductor structure is enabled by several features of this invention, including the use of a field plate for the field-limiting rings that is electrically separated from the over-voltage clamp. Preferably, the well of each field-limiting ring is continuous beneath the polysilicon layer in which the zener diodes are formed, while the field plate of each field-limiting ring is continuous above the same region of the polysilicon layer. Within the region of the polysilicon layer in which the zener diodes are formed, contact between the field plate and the well of each field-limiting ring is not permitted, such that the voltage of the zener diodes in the polysilicon above the field-limiting ring does not interfere with the field-limiting ring reaching its proper voltage to function correctly.

The above structure yields a semiconductor power device that is characterized by a BV of well in excess of 600 volts and protection from avalanche breakdown. Because the edge termination structure completely surrounds the "active" power devices, it eliminates spherical junctions associated with the use of sharp mask corners, which would otherwise cause high electric field peaks in the corners of the power device. In addition to the operational advantages discussed above, another notable advantage of this invention is that its fabrication is not complicated and does not require masking, implanting and diffusion steps for the sole purpose of forming the edge termination structure. Specifically, the wells, gate terminals and field plates of the edge termination structure can be formed simultaneously with the wells, gate/base terminals and metallizations of the active bipolar or FET power devices. As a result, the process of forming the device of this invention does not entail significantly greater processing steps than those of prior art processes employed to form over-voltage clamped power devices.

Other objects and advantages of this invention will be better appreciated from the following detailed description.

BRIEF DESCRIPTION OF THE DRAWINGS

The present invention will now be described, by way of example, with reference to the accompanying drawings, in which:

FIG. 5 is a cross-sectional view of the device of FIG. 4 through line 5—5; and

FIG. 6 is a cross-sectional view of the device of FIG. 4 through line 6—6.

DETAILED DESCRIPTION OF THE INVENTION

Figure 1:
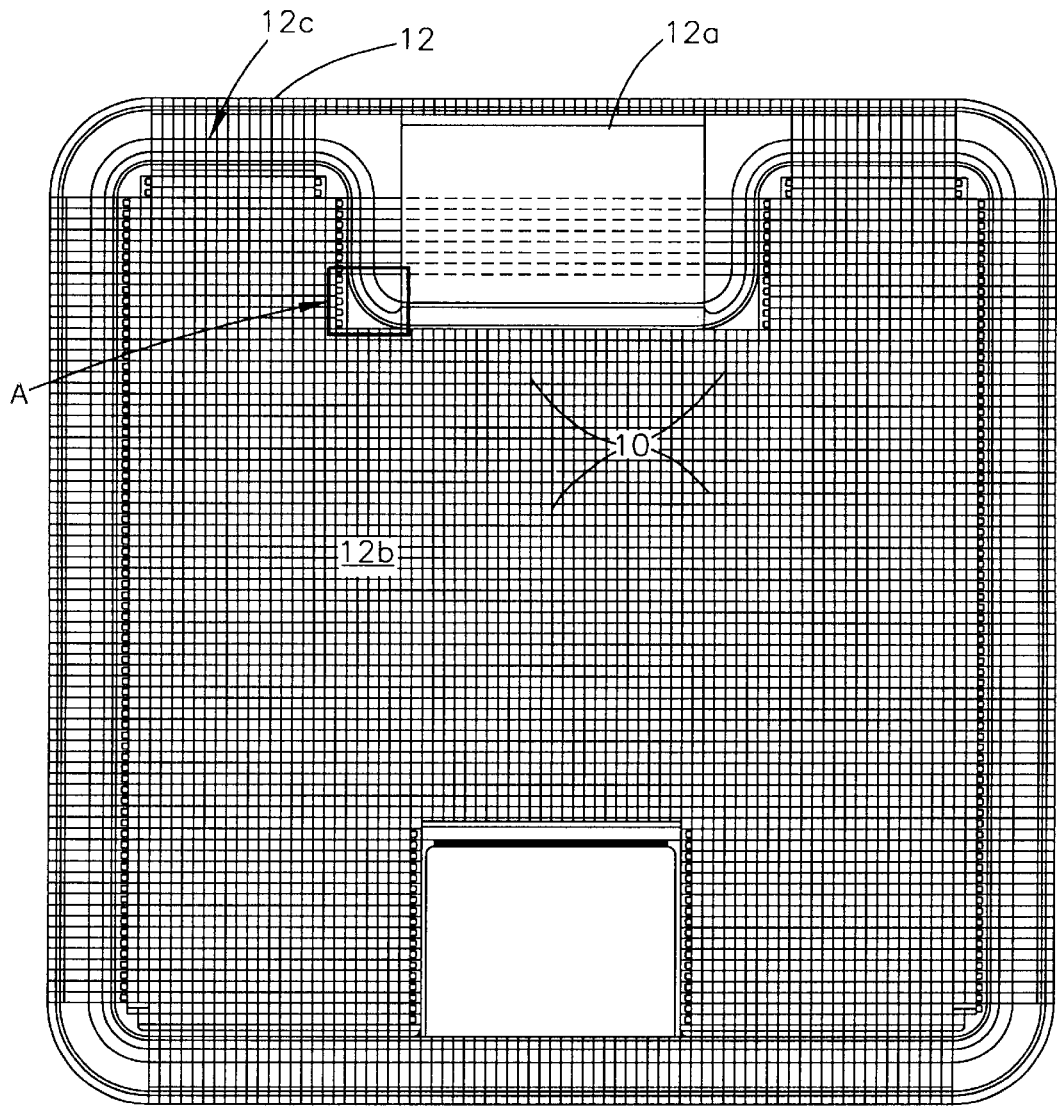
FIG. 1 is a plan view of a monolithic semiconductor power device provided with a voltage-clamp and an edge termination structure.
Figure 2:
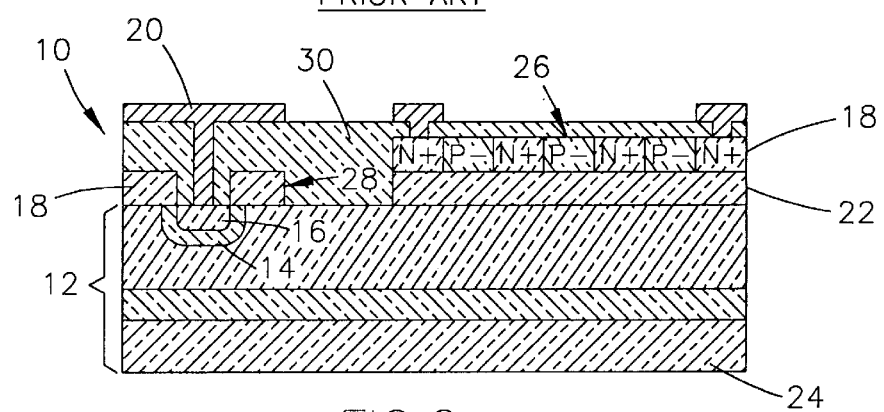
FIG. 2 is a cross-sectional view of a semiconductor power device of the prior art.
Figure 3:
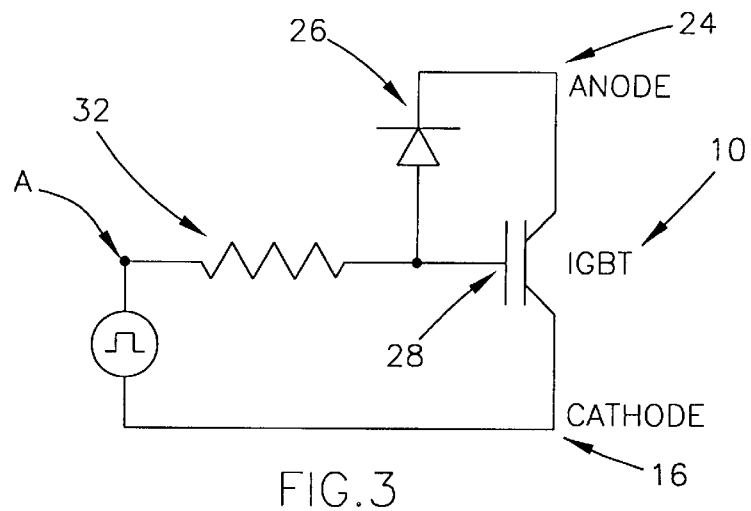
FIG. 3 is a schematic of a semiconductor power device of the prior art.
Figure 4:
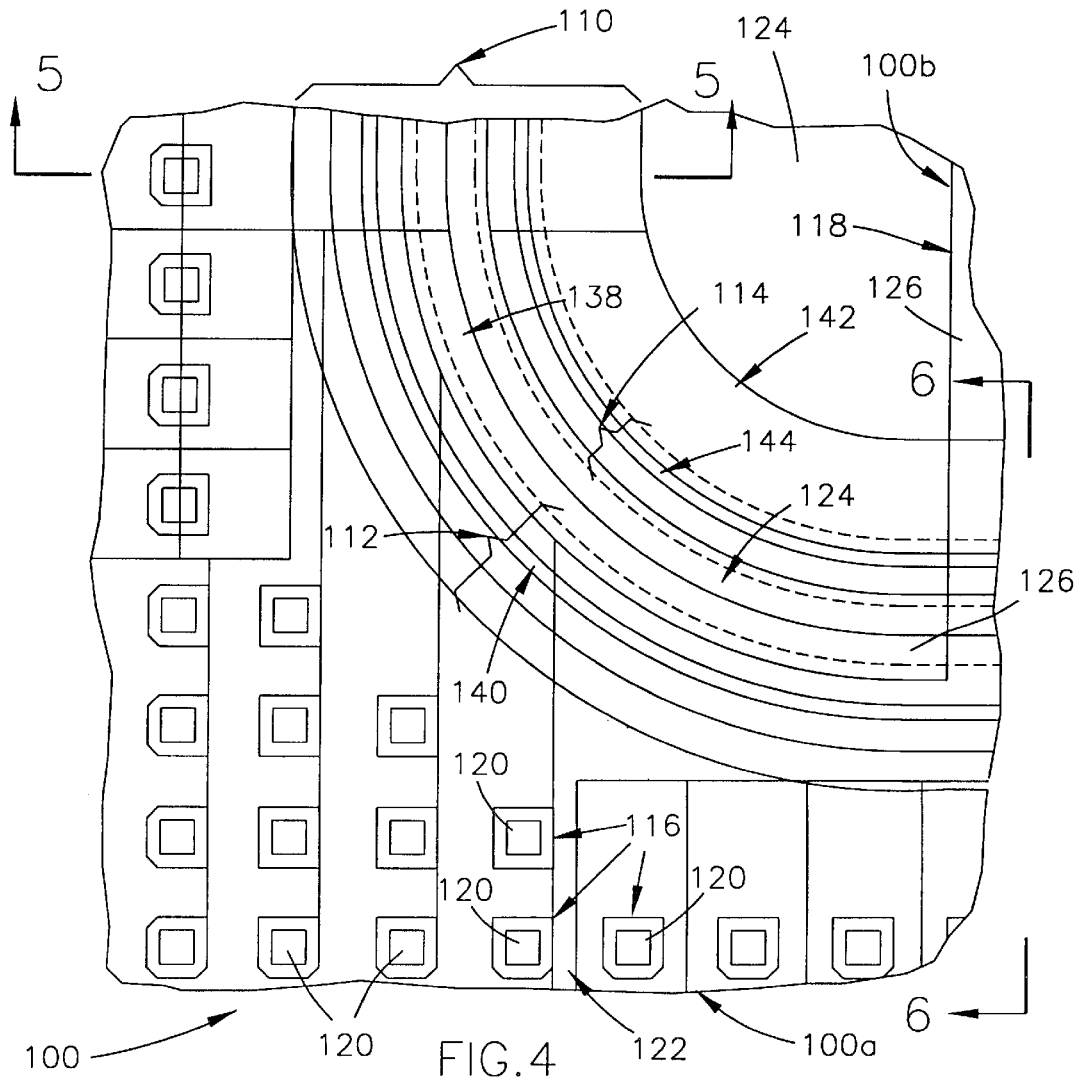
FIG. 4 is a plan view of a corner of an IGBT semiconductor power device in accordance with an embodiment of the invention, and illustrates an edge termination structure of this invention surrounding individual IGBTs within an interior region of the device.

Illustrated in FIGS. 4 through 6 is a semiconductor power device 100 that is configured in accordance with this invention. FIG. 4 is a plan view of an interior corner of the device 100, analogous to the framed interior corner "A" of the semiconductor power device shown in FIG. 1. This corner separates an interior region 100a of the device 100 from a rectangular-shaped peripheral region 100b along one edge of the device 100. As shown, the device 100 is equipped with an edge termination structure 110 composed of a continuous grounded well 112 and a field-limiting ring 114. The edge termination structure 110 completely surrounds a number of "active" devices 116 located in the interior region 100a of the device 100. As used herein, the term "active" is intended to denote a transistor device, and to distinguish such devices from the grounded well 112 and field-limiting ring 114 of the edge termination structure 110. The function of the edge termination structure 110 is to increase the breakdown voltage of the power device 100 as compared to a power device without edge termination.

Cross-sectional views through the semiconductor structure represented in FIG. 4 are shown in FIGS. 5 and 6. To afford a better understanding of the invention, the layers shown in FIGS. 5 and 6 are depicted as transparent in FIG. 4, to enable visualization of the relative placement of the individual layers, including the underlying regions shown in FIGS. 5 and 6. As seen in FIGS. 4, 5 and 6, the active devices 116 are illustrated as IGBTs, though FET devices such as DMOS transistors could be employed. Emitter contacts 120 for the IGBT devices 116 are formed by an emitter metal layer 122 that generally overlies the entire interior region 100a of the device 100, and extends through underlying oxide and polysilicon layers 124 and 126, respectively. As shown in FIGS. 5 and 6, the oxide layer 124, preferably a low temperature oxide (LTO), electrically insulates the emitter contacts 120 from the polysilicon layer 126.. The polysilicon layer 126 is dielectrically separated from the substrate 128 of the device 100 by either a field oxide layer 130 or, where appropriate, gate oxide layers 132.

As is conventional, each IGBT device 116 is formed by an appropriately-doped island 134 within an oppositely-doped well 136 beneath the emitter contact 120 and gate oxide layer 132. The substrate 128 is appropriately doped to serve as the collector of the IGBT devices 116, while those portions of the polysilicon layer 126 overlying the gate oxide layers 132 form the gate terminal of the devices 116. Suitable processing and doping techniques necessary to form the IGBT devices 116 described above are within the knowledge of one skilled in the art, and therefore will not be discussed in any detail.

As noted before, the edge termination structure 110 completely surrounds the interior region 100a of the substrate 128 in which the IGBT devices 116 are located. As shown in FIGS. 4 through 5, the grounded well 112 and a well forming the field-limiting ring 114 form a pair of continuous equipotential rings that prevent high electric fields that can be present when such rings are interrupted or form a sharp corner. For the same reason, the grounded well 112 and the well forming the field-limiting ring 114 are continuous through each corner along the edge of the interior region 100a of the substrate 128, and each maintains a large radius of curvature at the corners.

The grounded well 112 forms a main junction along the outward-most IGBT devices 116, in the sense that the grounded well 112 is formed by heavily doping the substrate 128 with a suitable dopant to be of the same electrical conductivity type as the wells 136 of the IGBT devices 116, and the well 112 is contiguous with, and preferably overlaps, the wells 136 of the IGBT devices 116 nearest the edge termination structure 110. The grounded well 112 is continuous, and lies beneath the polysilicon layer 126 as shown in FIGS. 5 and 6. A metal field plate 138 overlies the grounded well 112, and electrically contacts the polysilicon layer 126 along a single continuous contact 140, but is otherwise separated from the polysilicon layer 126 with the oxide layer 124. In the on-state, a voltage applied across the gate oxide 132 by the metal field plate 138 (gate metal) via the polysilicon layer 126 provides for the formation of a channel at the surface of the underlying well 136 of the IGBT device 116. In the off-state, the metal field plate 138 provides a field-plate over the edge of the grounded well 112, which serves to reduce the electric field in this area and thus increases the breakdown voltage of the device 100.

As also illustrated in FIGS. 4, 5 and 6, the field-limiting ring 114 surrounds the grounded well 112, and preferably is uniformly spaced from the grounded well 112 along its entire extent. Evenly spacing the field-limiting ring 114 from the grounded well 122 is critical to the breakdown voltage improvement of the edge termination arrangement, in that the spacing determines the voltage of the field-limiting ring 114, which has an optimal value. As with the grounded well 112, the field-limiting ring 114 is formed by heavily doping the substrate 128 with a suitable dopant to be of the same electrical conductivity type as the wells 136 of the IGBT devices 116. Also similar to the grounded well 112, the well forming the field-limiting ring 114 is continuous, and lies beneath the polysilicon layer 126 as shown in FIGS. 5 and 6. A metal field plate 142 overlies the field-limiting ring 114, and electrically contacts the well of the field-limiting ring 114 along a single contact 144 as shown in FIG. 5, but is separated from the polysilicon layer 126 by the oxide layers 124 and 130. Importantly, and as seen in FIGS. 4 and 6, the contact 144 does not extend through the peripheral region 100b of the substrate 128, i.e., that portion of the polysilicon layer 126 that extends toward the periphery of the device 100 and in which the zener diodes 118 are formed. As such, energizing the field-limiting ring 114 through the metal field plate 142 does not interfere with current flow between the zener diodes 118 and the IGBT devices 116 through the polysilicon layer 126.

Notably, in contrast to the grounded well 112, the string of zener diodes 118 preferably extends into the edge termination structure 110 so as to overly the field-limiting ring 114, as shown in FIG. 6. According to this invention, a significant improvement in yield results due to elimination of BV leakage at the edge termination 110 near the zener diodes 118. This problem was solved by causing the voltage in the zener diodes 118 to be approximately equal to the field-limiting ring 114 in the region above the ring 114. As an example, initial breakdown voltage was increased nearly 20% when the diode string 118 was moved from a point terminating just outside the field-limiting ring 114 to that shown in FIG. 6.

Though a single field-limiting ring 114 is shown in FIGS. 4 through 6, those skilled in the art will appreciate that multiple field-limiting rings could be employed, since the operation and physical location of the field-limiting ring 114 on the device 100 do not interfere with the function of the over-voltage clamp formed by the zener diodes 118 in the polysilicon layer 126. If multiple field-limiting rings are employed, each would have its own field plate. In the off-state, each additional field-limiting ring serves to further reduce the electric field and thereby increases the breakdown voltage of the device 100.

The "on" state of the semiconductor power device 100 is characterized by a positive voltage applied to the polysilicon layer 126 through the contact 140 formed by the metal field plate 138, such that the polysilicon layer 126 acts as a gate over the well 136 of each IGBT device 116. As a result, the surface of each well 136 is inverted, creating a channel in the well 136 through which electrons can laterally flow from the island 134 (the emitter terminal of the device 116) to the collector terminal formed by the substrate 128.

In accordance with this invention, the above structure can be readily formed by processing techniques known to those skilled in the art. Specifically, processes used in the fabrication of the device 100 include masking, implanting and diffusion steps to form the wells of the IGBT devices 116, grounded well 112, field-limiting ring 114 and the zener diodes 118. Conventional processing steps may also be used to form the oxide layers 124 and 130, the gate oxide 132, the polysilicon layer 126, and the metallizations that form the emitter metal layer 122 and the metal field plates 138 and 142. Because these processes are known to one skilled in the art, they will not be discussed in any detail.

According to the invention, the semiconductor power device 100 has a BV of well in excess of 600 volts and is protected from avalanche breakdown by the combination of the over-voltage clamp, the continuous grounded well 112 and at least one field-limiting ring 114. Because the edge termination structure 110 completely surrounds the "active"

power devices of the device 100, it eliminates spherical junctions associated with the use of sharp mask corners, which would otherwise cause high electric field peaks in the corners of the power device 100. In addition to these operational advantages, it is apparent to those skilled in the art that this invention does not require complicated fabrication techniques other than masking, implantation and diffusion techniques that are conventional to the art.

While our invention has been described in terms of a preferred embodiment, it is apparent that other forms could be adopted by one skilled in the art—for example, by modifying the layout or type of active devices or over-voltage clamp, modifying the edge termination structure, and using alternative materials to form the device. Accordingly, the scope of our invention is to be limited only by the following claims.

What is claimed is:

1. A semiconductor device comprising:
    a semiconductor substrate having an interior region and a peripheral region surrounding the interior region;
    a polysilicon layer overlying and electrically insulated from the substrate;
    a plurality of active semiconductor power devices formed in the interior region of the substrate, each of the power devices having an anode terminal, a cathode terminal and a gate/base terminal, the gate/base terminals being formed by the polysilicon layer;
    an over-voltage clamp in the peripheral region of the substrate, the over-voltage clamp comprising a string of zener diodes connected between the anode and gate/base terminals of each of the power devices, the zener diodes being formed in the polysilicon layer;
    an edge termination structure formed in the substrate so as to surround the interior region of the substrate and form a continuous barrier structure between the power devices and the over-voltage clamp, the edge termination structure comprising:
        a junction formed by a continuous grounded well underlying the polysilicon layer and completely surrounding the interior region of the substrate;
        a dielectric layer between a portion of the polysilicon layer and a portion of the continuous grounded well so as to form a gate terminal of the junction;
        at least one field-limiting ring formed by a continuous well underlying the polysilicon layer and completely surrounding the interior region of the substrate, the continuous well being of the same electrical conductivity type as the continuous grounded well, the field-limiting ring being electrically insulated from the polysilicon layer;
        a first field plate contacting the field-limiting ring and being electrically insulated from the polysilicon layer so as to be electrically insulated from the over-voltage clamp; and
        a second field plate electrically-contacting the polysilicon layer, the second field plate electrically-contacting the gate terminal of the junction and being electrically insulated from the field-limiting ring.

2. A semiconductor device as recited in claim 1 wherein the string of zener diodes overlies the field-limiting ring.

3. A semiconductor device as recited in claim 1 wherein each of the power devices comprises:
    a well of the same electrical conductivity type as the continuous grounded well of the edge termination structure, the well being contiguous with the continuous grounded well;
    an island in the well, the island being of a second electrical conductivity type; and
    a metallization electrically contacting the well and island so as to form the cathode terminal of the power device, the metallization being electrically insulated from the polysilicon layer.

4. A semiconductor device as recited in claim 1 wherein the continuous grounded well and the well forming the field-limiting ring are p-type regions in the substrate.

5. A semiconductor device as recited in claim 1 wherein the field-limiting ring surrounds the continuous grounded well.

6. A semiconductor device as recited in claim 5 wherein the field-limiting ring is spaced apart from the continuous grounded well a substantially constant distance.

7. A semiconductor device as recited in claim 1 wherein the first field plate is continuous and completely surrounds the interior region of the substrate.

8. A semiconductor device as recited in claim 1 wherein the second field plate is continuous and completely surrounds the interior region of the substrate.

9. A semiconductor device as recited in claim 1 wherein the first field plate forms a single contact with the field-limiting ring and the second field plate forms a single continuous contact with the continuous grounded well.

10. A semiconductor device as recited in claim 1 wherein the polysilicon layer has a first portion lying within the interior region of the substrate and a contiguous second portion extending into the peripheral region of the substrate.

11. A semiconductor device as recited in claim 10 wherein a portion of the first field plate overlies the second portion of the polysilicon layer, the first field plate forms at least one contact with the field-limiting ring, and the at least one contact does not extend into the portion of the first field plate.

12. A semiconductor device as recited in claim 10 wherein a portion of the second field plate overlies the second portion of the polysilicon layer, the second field plate forms a continuous contact with the continuous grounded well, and the continuous contact extends through the portion of the second metal field plate.

13. A zener diode-clamped semiconductor device comprising:
    a substrate having a layer of a first conductivity type to form a collector terminal of the semiconductor device, the substrate having an interior region and a peripheral region;
    a dielectric layer on the substrate;
    a polysilicon layer on the dielectric layer so as to be electrically insulated from the substrate, the polysilicon layer having a first portion present in the interior region and a second portion extending into a limited portion of the peripheral region of the substrate;
    a plurality of insulated-gate bipolar transistors within the interior region, each of the transistors comprising:
        a well of the first conductivity type in the substrate;
        an island of a second conductivity type in the well, the well electrically-insulating the island from the substrate;
        an emitter metallization electrically-contacting the island and the well, the emitter metallization overlaying and being electrically insulated from the polysilicon layer; and
        a gate terminal formed by a portion of the polysilicon layer overlying and electrically insulated from the well;

an over-voltage clamp formed in the second portion of the polysilicon layer, the over-voltage clamp comprising a string of zener diodes connected between the collector terminal and the gate terminals of each of the transistors; and an edge termination structure in the substrate so as to separate the interior region and the peripheral region of the substrate, the edge termination structure comprising;

a continuous grounded well of the first conductivity type underlying the polysilicon layer so as to completely surround the interior region of the substrate;

an oxide layer between a portion of the polysilicon layer and a portion of the continuous grounded well so as to form a gate terminal therebetween for the continuous grounded well;

at least one field-limiting ring underlying the polysilicon layer so as to completely surround the interior region of the substrate, the field-limiting ring being formed by a continuous well of the first conductivity type that is electrically insulated from the polysilicon layer and spaced apart from the continuous grounded well, the string of zener diodes overlying the field-limiting ring;

a first metal field plate contacting the field-limiting ring and being electrically insulated from the polysilicon layer so as to be electrically insulated from the over-voltage clamp; and a second metal field plate electrically-contacting the polysilicon layer and the gate terminal of the continuous grounded well, the second metal field plate being electrically insulated from the field-limiting ring.

14. A zener diode-clamped semiconductor device as recited in claim 13 wherein the well of each transistor is contiguous with the continuous grounded well of the edge termination structure.

15. A zener diode-clamped semiconductor device as recited in claim 13 wherein the field-limiting ring surrounds the continuous grounded well, and wherein the string of zener diodes do not overly the continuous grounded well.

16. A zener diode-clamped semiconductor device as recited in claim 13 wherein the field-limiting ring is spaced apart from the continuous grounded well a substantially constant distance.

17. A zener diode-clamped semiconductor device as recited in claim 13 wherein the first metal field plate is continuous and completely surrounds the interior region of the substrate.

18. A zener diode-clamped semiconductor device as recited in claim 13 wherein the second metal field plate is continuous and completely surrounds the interior region of the substrate.

19. A zener diode-clamped semiconductor device as recited in claim 13 wherein the first metal field plate forms a single contact with the field-limiting ring and the single contact does not extend through the second portion of the polysilicon layer.

20. A zener diode-clamped semiconductor device as recited in claim 13 wherein the second metal field plate forms a single continuous contact with the continuous grounded well.

* * * * *